United States Patent [19]

Egerbacher et al.

[11] Patent Number: 4,567,504
[45] Date of Patent: Jan. 28, 1986

[54] SEMICONDUCTOR COMPONENT WITH A DISC-SHAPED CASE

[75] Inventors: Werner Egerbacher, Munich; Dieter Wunderlich, Geiselbullach, both of Fed. Rep. of Germany

[73] Assignee: Siemens Aktiengesellschaft, Berlin and Munich, Fed. Rep. of Germany

[21] Appl. No.: 589,392

[22] Filed: Mar. 14, 1984

Related U.S. Application Data

[63] Continuation of Ser. No. 141,255, Apr. 18, 1980, abandoned.

[30] Foreign Application Priority Data

Apr. 19, 1979 [DE] Fed. Rep. of Germany ....... 2915862

[51] Int. Cl.[4] ................ H01L 21/447; H01L 21/603; H01L 23/10
[52] U.S. Cl. ........................................ 357/79; 357/74
[58] Field of Search ........................................ 357/79

[56] References Cited

U.S. PATENT DOCUMENTS 4,063,348 12/1977 Borden et al. ...................... 357/79
4,099,201 7/1978 Mueller ................................. 357/79
4,141,030 2/1979 Eisele et al. ......................... 357/79
4,150,394 4/1979 Sugawa et al. ..................... 357/79
4,162,514 7/1979 DeBruyne et al. ................. 357/79
4,240,099 12/1980 Brandt et al. ....................... 357/79
4,274,106 6/1981 Ohdate ................................. 357/79
4,399,452 8/1983 Nakashima et al. ................ 357/79

Primary Examiner—William D. Larkins
Assistant Examiner—Sheila V. Clark
Attorney, Agent, or Firm—Herbert L. Lerner; Laurence A. Greenberg

[57] ABSTRACT

Semiconductor component with a disc-shaped case, including a ceramic ring having an inner surface, two metal discs, metal rings connecting the metal discs to the ceramic ring, a semiconductor body disposed in the case between the metal discs, an additional metal ring fastened to the periphery of each of the metal discs within the case, at least one electrically and thermally insulating foil having a high energy of evaporation disposed between the semiconductor body and the ceramic ring covering the inner surface of the ceramic ring and overlapping the additional metal rings.

5 Claims, 4 Drawing Figures

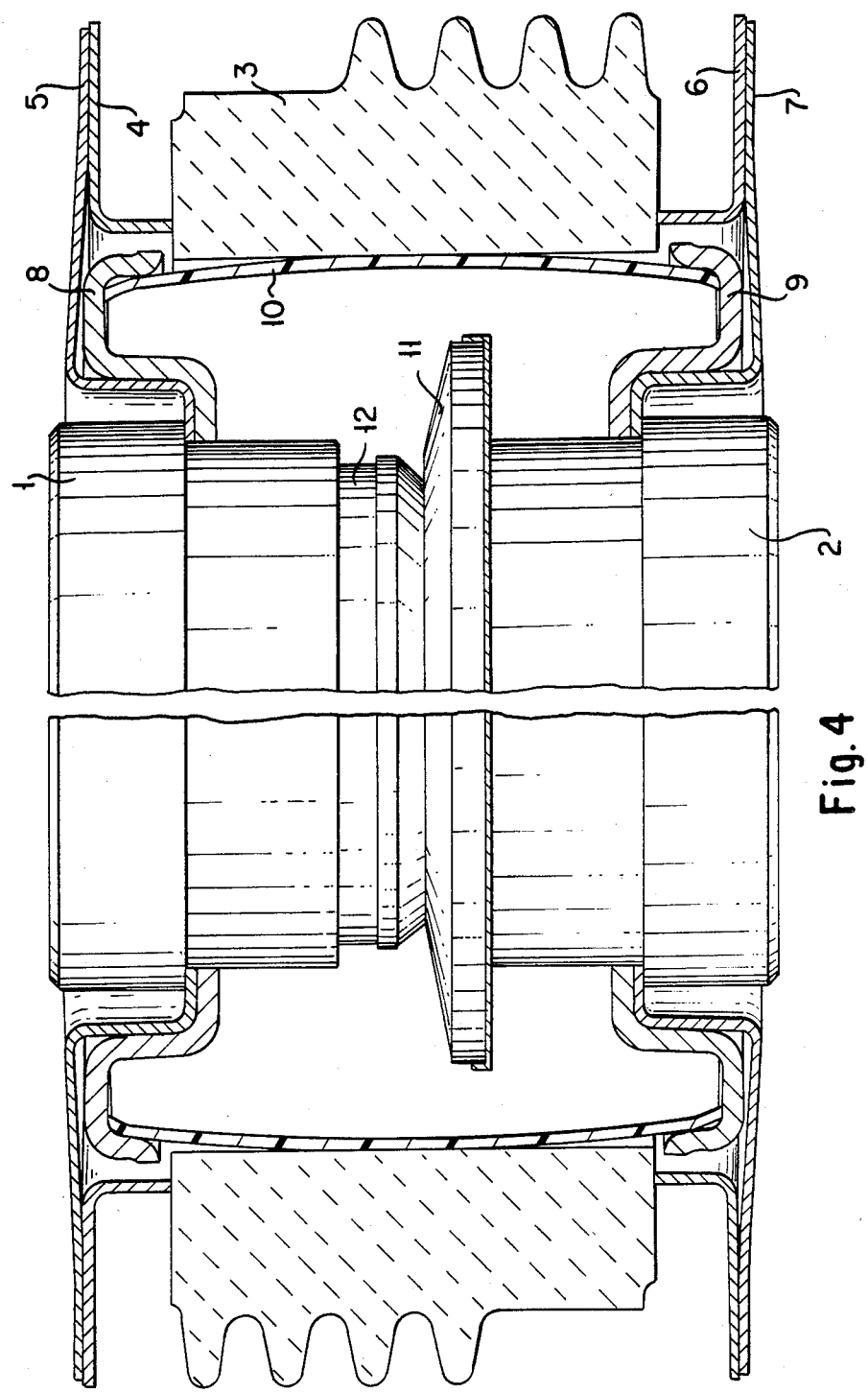

SEMICONDUCTOR COMPONENT WITH A DISC-SHAPED CASE

This application is a continuation, of application Ser. No. 141,255, filed Apr. 18, 1980 now abandoned.

The invention relates to a semiconductor component with a disc-shaped case comprising a ceramic ring and two metal discs connected by metal rings to the ceramic ring, a semiconductor body disposed in the case between the metal discs, and an insulating layer between the semiconductor body and the inside of the ceramic ring.

Semiconductor components with a disc-shaped case are used in high-power installations. Since these installations must carry large continuous currents, the use of fuses for their protection is indispensable. These fuses must have a very high response current and therefore a large explosion integral $\int i^2 dt$. The explosion integral of conventional disc-shaped cases, however, is smaller in many cases than that of the fuses. This means that, especially in the event of large short circuit currents in the backward direction, an arc developes in the semiconductor component. The arc melts the semiconductor material and thin metal parts such as the above-mentioned metal discs of the case, and the arc and melted material is urged outward in the form of an explosion. In addition, the ceramic ring is subjected to a temperature shock, which can lead to the development of cracks and thereby to the destruction of the ceramic.

To avoid these disadvantages it has become known to coat the inside of the ceramic ring and at least the thin metal rings on the inside with a layer of insulating material. In the assembled condition, the plastic coating, however, has at least one joint, through which the arc can reach the outside and/or damage the ceramic.

It is accordingly an object of the invention to provide a semiconductor component with a disc-shaped case which overcomes the hereinafore-mentioned disadvantages of the heretofore known devices of this general type, so that damage to the ceramic and the escape of fused material within the range of interest of the explosion integral $\int i^2 dt$ become impossible.

With the foregoing and other objects in view there is provided, in accordance with the invention, a semiconductor component with a disc-shaped case, comprising a ceramic ring having an inner surface, two metal discs, metal rings connecting the metal discs to the ceramic ring, a semiconductor body disposed in the case between the metal discs, an additional metal ring fastened to the periphery of each of the metal discs within the case, at least one electrically and thermally insulating foil having a high energy of evaporation disposed between the semiconductor body and the ceramic ring covering the inner surface of the ceramic ring and overlapping the additional metal rings.

In accordance with another feature of the invention, the ceramic ring has end faces, the additional metal rings have outer edges and sides facing toward the interior of the case, the side of at least one of the additional metal rings has an embossing formed therein extending in the circumferential direction of the additional metal ring, the outer edge of the at least one additional metal ring overlaps an end face of the ceramic ring, and the foil extends into the embossing.

In accordance with a further feature of the invention, there is provided a seal disposed between the outer edge of the at least one additional metal ring and the end face of the ceramic ring.

In accordance with an added feature of the invention, one of the additional metal rings is at least substantially flat and has an outer rim, the outer rim being disposed opposite the inner surface of the ceramic ring.

In accordance with an additional feature of the invention, the additional metal rings are formed of nonmagnetic steel.

In accordance with a concomitant feature of the invention, there is provided at least one contact disc disposed between the semiconductor body and one of the metal discs.

Other features which are considered as characteristic for the invention are set forth in the appended claims.

Although the invention is illustrated and described herein as embodied in a semiconductor component with a disc-shaped case, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 4 is a cross sectional view of the embodiment of FIG. 1 including both ends of the thyristor housing.

Figure 1:
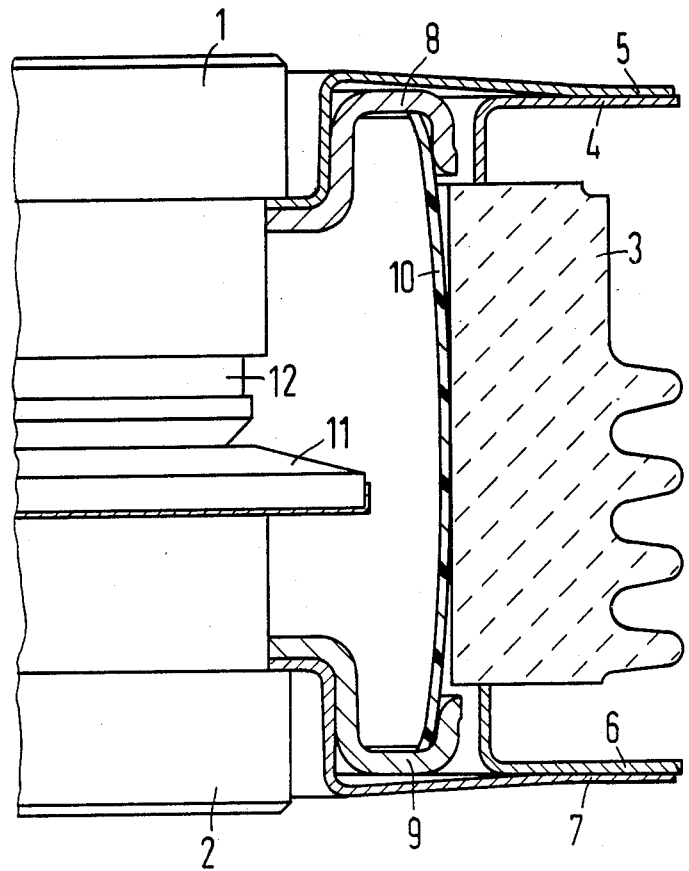
FIG. 1 is a diagrammatic fragmentary cross-sectional view of a first embodiment of the invention taken through a disc-shaped case for a semiconductor component.

Referring to the figures of the drawing and first particularly to FIGS. 1 and 4 thereof, there is seen a housing comprising two metallic cover plates or discs 1, 2 which are connected through thin, flexible metal rings to the end faces of a ceramic ring 3. The metal rings can each be composed, for instance, of two flange-like parts 4,5 and 6,7. The flange-like parts 4,6 are hard-soldered, for instance, to the end face of the ceramic ring. The flange-like parts 5,7 can be hard-soldered to the cover plates 1,2. When the case is selaed, the parts 4,5 and 6,7, respectively, are then welded together.

Between the metal discs or cover plates 1,2 there is a semiconductor body 11 which makes contact with the metal discs 1, 2 either directly, or indirectly with the interposition of a contact disc 12. At the circumference or inner periphery of the metal discs 1,2 and concentrically thereto, metal rings 8, 9, for instance, are fastened by shrinking or swaging. These metal rings are provided with embossings running parallel to the circumferential direction; the concave side of the embossing points toward the interior of the case. To avoid the development of undesirable noise in operation, these metal rings may be formed of nonmagnetic metal, such as nonmagnetic steel, for instance.

In the interior of the housing, a thermally and electrically insulating plastic foil 10 is disposed. The foil 10 surrounds the semiconductor body 11 and covers the inside of the ceramic ring 3. The foil 10 extends into the embossings of the metal rings 8, 9 and thus overlaps the rings. The foil 10 is formed of a material with a high energy or evaporation, such as polytetrafluoroethylene (PTFE), fluororethylene-propylene (FEP) or a polyimide.

In the event of a short circuit, the arc generated will thus not be able to come in touch with the ceramic cylinder or ring 3 and the thin flexible metal rings. This mitigates the temperature shock for the ceramic ring 3 to such an extent that cracks cannot occur. The flexible metal rings are prevented from burning through by the metal rings 8,9 until the fuses blow. If they are formed of steel, the metal rings can be between 1 and 2 mm thick. Rings of other metals can be made thinner or thicker, depending on their melting point. The foil can be 0.5 mm thick, for instance, and can be applied in one or more layers on top of each other. The escape of melted material between the metal rings and the foil is reliably prevented by the overlap of both parts, since the pressure occurring in the interior presses the foils to the edge of the metal rings.

Figure 2:
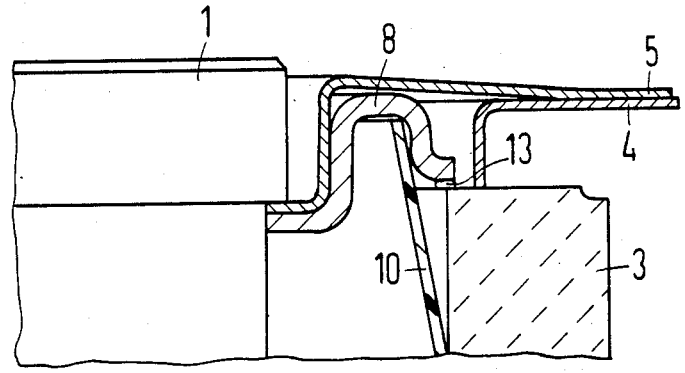
FIG. 2 is a view similar to FIG. 1 of a second embodiment of the invention.

As shown in the embodiment of FIG. 2, an additional seal 13 can further be attached between the end face of the ceramic ring 3 and the outer edge of the metal rings. This seal may be formed, for instance, of an elastic varnish, such as silicone varnish, for instance.

Figure 3:
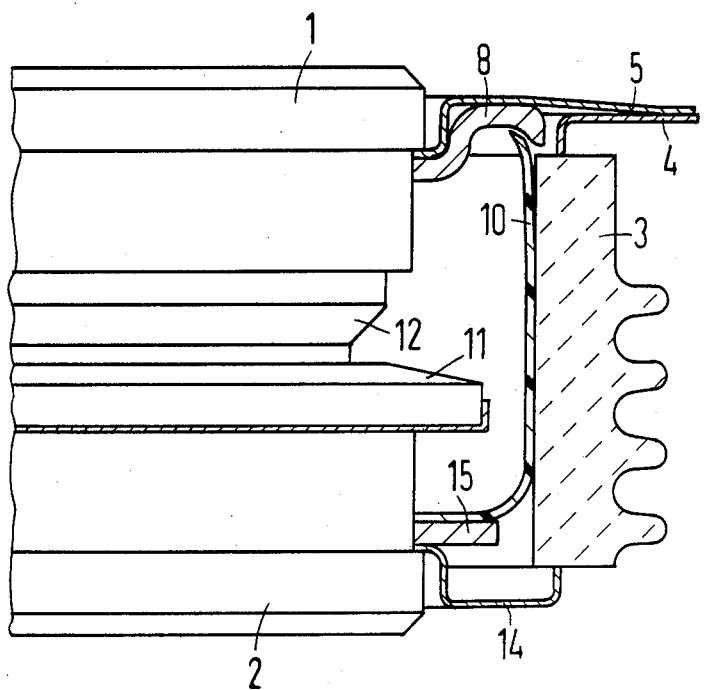
FIG. 3 is another view similar to FIGS. 1 and 2 of a third embodiment of the invention.

In the embodiment example according to FIG. 3, a flat metal ring 15 is connected to the metal plate 2 instead of the lower metal ring. The flat metal ring 15 is provided with an embossing and is disposed concentrically with the metal plate 2. The foil 10 overlaps the metal ring 15 and seals the interior against the escape of melted material. This metal ring, too, can be formed of nonmagnetic steel. It may likewise be 1 to 2 mm thick. The outer rim of the metal ring 15 is opposite the inside or inner surface of the ceramic ring 3. In order to join the metal plate 2 to the ceramic ring 3, a somewhat differently shaped flexible metal ring 14 is provided in FIG. 3. In the event of a short circuit, the metal ring 14 is reliably protected against the occurring arc.

There are claimed:

1. Semiconductor component with a case having an interior, comprising a ceramic ring having an inner surface and end faces, two metal discs having peripheries, metal ring members connecting said metal discs to said ceramic ring, a semiconductor body disposed in the case between said metal discs, additional metal ring members each being respectively fastened to the periphery of one of said metal discs in the case, said additional metal ring member having outer edges and sides facing toward the interior of the case, said side of at least one of said additional metal ring members having an indentation formed therein defining a concave surface facing toward the interior of the case, said outer edge of said at least one additional metal ring member overlapping an end face of said ceramic ring, and at least one electrically and thermally insulating one-piece foil having a high energy of evaporation disposed between the simiconductor body and said ceramic ring covering said inner surface of said ceramic ring, overlapping said additional metal ring members and extending into said indentation.

2. Semiconductor component according to claim 1, including a seal disposed between said outer edge of said at least one additional metal ring member and said end face of said ceramic ring.

3. Semiconductor component according to claim 1, or 2 wherein one of said additional metal ring members is at least substantially flat and has an outer rim, said outer rim being disposed opposite said inner surface of said ceramic ring.

4. Semiconductor component according to claim 1, or 2 wherein said additional metal ring members are formed of nonmagnetic steel.

5. Semiconductor component according to claim 1, wherein said foil extends beyond said end faces of said ceramic ring.

* * * * *